(12) United States Patent
Hagelin et al.

(10) Patent No.: US 8,781,802 B2
(45) Date of Patent: Jul. 15, 2014

(54) SIMULATION DEVICE AND SIMULATION METHOD

(75) Inventors: Hans-Ove Hagelin, Linköping (SE); Johan Ehlin, Linköping (SE)

(73) Assignee: SAAB AB, Linköping (SE)

( * ) Notice: Subject to any disclaimer, the term of this patent is extended or adjusted under 35 U.S.C. 154(b) by 1155 days.

(21) Appl. No.: 11/898,877

(22) Filed: Sep. 17, 2007

(65) Prior Publication Data

US 2008/0189092 A1 Aug. 7, 2008

(30) Foreign Application Priority Data

Sep. 15, 2006 (EP) .................................. 06120729

(51) Int. Cl.
| | | |
|---|---|---|
| *G06F 17/50* | (2006.01) | |
| *G06F 7/60* | (2006.01) | |
| *G06F 13/10* | (2006.01) | |
| *G06F 11/26* | (2006.01) | |

(52) U.S. Cl.
CPC ............ *G06F 13/105* (2013.01); *G06F 11/261* (2013.01); *G06F 17/50* (2013.01)
USPC ............................ 703/6; 703/1; 703/2; 703/7

(58) Field of Classification Search
USPC .............................................................. 703/6
See application file for complete search history.

(56) References Cited

U.S. PATENT DOCUMENTS

| | | | | |
|---|---|---|---|---|
| 4,057,913 A | * | 11/1977 | Eisenberg | 434/6 |
| 4,176,468 A | * | 12/1979 | Marty, Jr. | 434/14 |
| 4,424,038 A | * | 1/1984 | Tingleff et al. | 434/2 |
| 4,490,117 A | * | 12/1984 | Parker | 434/35 |
| 4,729,737 A | * | 3/1988 | Reagan et al. | 434/35 |
| 4,959,015 A | * | 9/1990 | Rasinski et al. | 434/2 |
| 5,002,490 A | * | 3/1991 | Blackstone | 434/14 |
| 5,208,757 A | * | 5/1993 | Appriou et al. | 701/23 |
| 5,325,302 A | * | 6/1994 | Izidon et al. | 701/301 |
| 5,378,155 A | * | 1/1995 | Eldridge | 434/11 |
| 5,381,338 A | * | 1/1995 | Wysocki et al. | 701/409 |
| 5,421,728 A | * | 6/1995 | Milden | 434/5 |
| 5,428,530 A | * | 6/1995 | Brown et al. | 703/8 |
| 5,474,453 A | * | 12/1995 | Copperman | 434/29 |
| 5,549,477 A | * | 8/1996 | Tran et al. | 434/5 |
| 5,587,904 A | * | 12/1996 | Ben-Yair et al. | 701/470 |
| 5,807,109 A | * | 9/1998 | Tzidon et al. | 434/35 |
| 5,838,262 A | * | 11/1998 | Kershner et al. | 340/945 |

(Continued)

OTHER PUBLICATIONS

European Search Report—Aug. 2, 2007.

*Primary Examiner* — Shambhavi Patel
(74) *Attorney, Agent, or Firm* — Venable LLP; Eric J. Franklin (57) ABSTRACT

A simulation device for generating an answer to a question inputted thereto. A communication unit is configured to input a selected question associated with a first criterion and a second criterion. A generating unit is configured to generate a copy of a continuously updated environment model. A generating unit is configured to generate a simulation scenario, depending upon the first criterion. A modifying unit is configured to modify the generated simulation scenario. An applying unit is configured to apply the modified generated simulation scenario to the generated copy of the continuously updated environment model. A simulating unit is configured to perform a simulation process in accordance with the second criterion. An answering unit is configured to answer information, depending upon a result of the simulation process.

16 Claims, 4 Drawing Sheets

(56) References Cited

U.S. PATENT DOCUMENTS

| | | | |
|---|---|---|---|
| 5,995,903 A * | 11/1999 | Smith et al. | 701/470 |
| 6,054,937 A * | 4/2000 | Von Viebahn et al. | 340/961 |
| 6,080,063 A * | 6/2000 | Khosla | 463/42 |
| 6,101,431 A * | 8/2000 | Niwa et al. | 701/14 |
| 6,259,378 B1 * | 7/2001 | Block | 340/963 |
| 6,278,401 B1 * | 8/2001 | Wigren | 342/195 |
| 6,283,756 B1 * | 9/2001 | Danckwerth et al. | 434/11 |
| 6,360,193 B1 * | 3/2002 | Stoyen | 703/17 |
| 6,433,729 B1 * | 8/2002 | Staggs | 342/29 |
| 6,480,120 B1 * | 11/2002 | Meunier | 340/970 |
| 6,496,760 B1 * | 12/2002 | Michaelson et al. | 701/3 |
| 6,538,581 B2 * | 3/2003 | Cowie | 340/961 |
| 6,597,380 B1 * | 7/2003 | Wang et al. | 715/782 |
| 6,604,044 B1 * | 8/2003 | Kirk | 701/120 |
| 6,643,580 B1 * | 11/2003 | Naimer et al. | 701/467 |
| 6,725,152 B2 * | 4/2004 | Moitra et al. | 701/410 |
| 6,785,610 B2 * | 8/2004 | Baker et al. | 701/301 |
| 6,822,583 B2 * | 11/2004 | Yannone et al. | 340/945 |
| 6,865,477 B2 * | 3/2005 | Nicosia et al. | 701/446 |
| 6,885,939 B2 * | 4/2005 | Schmidt et al. | 701/428 |
| 6,910,892 B2 * | 6/2005 | Lechner | 434/43 |
| 6,963,800 B1 * | 11/2005 | Milbert | 701/533 |
| 6,972,696 B2 * | 12/2005 | Rogers et al. | 340/971 |
| 6,985,810 B2 * | 1/2006 | Moitra et al. | 701/410 |
| 7,010,398 B2 * | 3/2006 | Wilkins et al. | 701/3 |
| 7,047,861 B2 * | 5/2006 | Solomon | 89/1.11 |
| 7,148,835 B1 * | 12/2006 | Bricker et al. | 342/20 |
| 7,215,256 B2 * | 5/2007 | Reusser et al. | 340/975 |
| 7,283,064 B2 * | 10/2007 | He | 340/973 |
| 7,330,844 B2 * | 2/2008 | Stoyen | 706/60 |
| 7,375,678 B2 * | 5/2008 | Feyereisen et al. | 342/180 |
| 7,403,132 B2 * | 7/2008 | Khatwa | 340/970 |
| 7,599,765 B2 * | 10/2009 | Padan | 701/3 |
| 7,646,313 B2 * | 1/2010 | Winkler et al. | 340/961 |
| 7,647,232 B2 * | 1/2010 | Moitra et al. | 705/1.1 |
| 8,005,657 B2 * | 8/2011 | Herman et al. | 703/8 |
| 2001/0013836 A1 * | 8/2001 | Cowie | 340/961 |
| 2002/0080059 A1 * | 6/2002 | Tran | 342/29 |
| 2003/0122701 A1 * | 7/2003 | Tran | 342/29 |
| 2003/0132860 A1 * | 7/2003 | Feyereisen et al. | 340/973 |
| 2003/0215771 A1 | 11/2003 | Bartoldus | |
| 2004/0219491 A1 * | 11/2004 | Shlomo | 434/11 |
| 2005/0065682 A1 * | 3/2005 | Kapadia et al. | 701/35 |
| 2006/0004497 A1 * | 1/2006 | Bull | 701/10 |
| 2006/0178758 A1 * | 8/2006 | Koriat | 700/12 |
| 2007/0077540 A1 * | 4/2007 | Testrake et al. | 434/37 |
| 2008/0158256 A1 * | 7/2008 | Russell et al. | 345/629 |
| 2009/0081619 A1 * | 3/2009 | Miasnik | 434/21 |

* cited by examiner

Fig. 5

SIMULATION DEVICE AND SIMULATION METHOD

CROSS-REFERENCE TO RELATED APPLICATIONS

This application claims priority to European patent application 06120729.6 filed 15 Sep. 2006.

FIELD OF THE INVENTION

The invention relates in general to a simulation device. In particular the invention relates to a device and arrangement for generating answers to posed questions by means of simulations.

The invention also relates to a simulation method for generating answers to posed questions. In particular the invention relates to a method for generating answers to a posed question by means of simulations.

Furthermore, the invention relates to software adapted to perform steps of the simulation method when executed on a computer.

BACKGROUND OF THE INVENTION

The present invention relates to situation analysis and choice of tactics onboard a platform, for example a flying platform, such as an airplane, manned or unmanned.

A driver of a platform, e.g. a pilot of an airplane, has to make many decisions in real time to drive in a safe and correct way. Different means for assisting a pilot is typically provided in platforms of today.

The term "situation analysis" relates to the analysis the driver performs in different situations while driving the platform. One situation may be an air plane-to-plane combat situation. Such a situation is generally very stressful and complicated for each involved pilot, seeing that the required analysis of the situation is mentally trying. This especially holds true when the situation is of a jumbly sort, e.g. involving a plurality of hostile airplanes. The driver of the platform must more or less continuously process provided information to perform a mental analysis so as to try to answer relevant questions. Examples of questions may be:

which of the different airplanes are hostile?
how threatened is my own airplane by a particular hostile airplane?
if a hostile target tracking/radar measurement is supposed to be more than one hostile airplane, is the own platform/own group of platforms threatened?

The term "choice of tactics" relates to considerations and choices performed by the driver regarding actions of airplanes within the own group or even only regarding future actions of the own airplane. The driver of the platform must also here, more or less continuously, process provided data so as to perform a mental analysis so as to try to answer relevant questions. Examples of questions may be:

should a weapon be fired now, later, or not at all?
should present mission be aborted?
In a civilian application: If own platform and an approaching airplane continue on course, will there later be a make way situation?

Thus, complex situation analysis and choice of tactics are today duties of the driver. The driver is today performing the situation analysis and the choice of tactics based on information provided by different indicators. It therefore exist a need to provide means arranged to facilitate the analysis process within a platform, such as an airplane.

It should be noted that the platform may alternatively be an UAV (Unmanned Aerial Vehicle), wherein an autonomous decision maker needs to be provided with adequate basic data, answers to questions exemplified above, among others.

SUMMARY OF THE INVENTION

An object according to an aspect of present invention is to provide a simulation device which allows generation of an answer to complex questions relating to situations analysis and/or choice of tactics within a platform.

Another object according to an aspect of present invention is to provide a simulation device which allows solving of tasks of operational analysis character "on-line" within a platform.

An aspect of the invention relates to the problem of ennobling provided information in a fast and cost effective manner.

An aspect of the invention relates to the problem of achieving a user-friendly means for effective support regarding situation analysis and/or choice of tactics within a platform.

These problems are solved by a simulation device for generating an answer to a question inputted thereto, said device comprising:

communication means for inputting a selected question associated with a first criterion and a second criterion;
means for generating a copy of a continuously updated environment model;
means for generating a simulation scenario, depending upon said first criterion;
means for modifying the generated simulation scenario;
means for applying the modified generated simulation scenario to the generated copy of the continuously updated environment model;
means for performing a simulation process in accordance with the second criterion;
means for generating answer information, depending upon a result of said simulation process.

These problems are also solved by a computer programme comprising a programme code for performing the simulation method steps, when said computer programme is run on a computer.

These problems are also solved by a computer programme product comprising a program code stored on a computer readable media for performing the simulation method steps, when said computer programme is run on the computer.

These problems are also solved by a computer programme product directly storable in an internal memory of a computer, comprising a computer programme for performing the simulation method steps, when said computer programme is run on the computer.

One positive outcome of the simulation device and the simulation method is that more reliable static and dynamic calculations may be performed within a platform by implementing use of the invention.

Implementation of the method according to the invention provides a more robust procedure for generating an answer to a posed complex question, wherein the driver of the platform is provided with a powerful tool allowing reduced stress in stressful situations. Further, the simulation device is user friendly.

By using the simulation device as a complement to indicators provided in the platform, a positive synergetic effect is achieved. Namely, the information indicated by the indicators may be used for the different simulations without reducing the overall performance of the platform.

The present invention further provides improved accuracy of information required to make appropriate decisions within a platform in different flight situations.

A beneficial contribution resulting from application of the method according to an aspect of the invention is improved overview and understanding of the surrounding of the platform, and further leads to a reduced amount of information provided to a driver/pilot of the platform, so as to facilitate decisions during complex flight situations.

The present invention may also be used in so called embedded training, which results in a very cost effective training of drivers. In this case the simulation device is provided in a simulation centre allowing safe training of said drivers.

Another beneficial contribution resulting from application of the method according to the invention is that more complex situations may be managed regarding situation analysis using the simulation method according to the invention. Also, a greater number of situations to be analysed may be managed using the simulation method according to the invention because a plurality of simulation can be run simultaneously.

The architecture of the simulation device is thus providing a flexible arrangement for answering to different types of complex posed questions by means of simulations.

Additional objects, advantages and novel features of the present invention will become apparent to those skilled in the art from the following details, as well as by practice of the invention. While the invention is described below, it should be understood that the invention is not limited to the specific details disclosed. A person skilled in the art having access to the teachings herein will recognise additional applications, modifications and embodiments in other fields, which are within the scope of the invention.

BRIEF DESCRIPTION OF THE DRAWINGS

For a more complete understanding of the present invention and further objects and advantages thereof, reference is now made to the examples shown in the accompanying drawings, in which.

QUESTIONS AND SIMULATIONS

Figure 5:
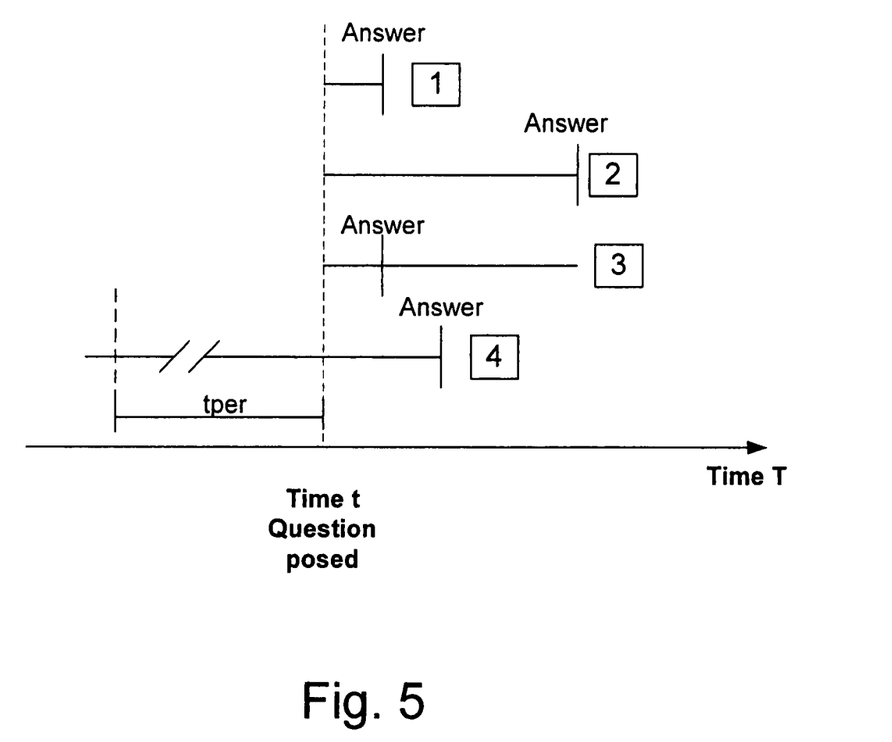
FIG. 5 schematically illustrates an overview of different simulation representations according to an aspect of the present invention.

FIG. 5 schematically illustrates four different types of simulations, each relating to a particular type of question. The respective questions are posed at a time point t. According to one embodiment there are four different types of simulations, which are listed below.

1. Simulation relating to a "static" question in real time;
2. Simulation relating to a "dynamic" question in real time;
3. Simulation relating to a question requiring prediction simulation;
4. Simulation relating to a question requiring estimation of historical data.

An example question of the first simulation type [1] may be—"Is a surrounding platform X within reach of any missile Y of the platform 10?". In other words, "Is it possible to fight a particular entity, such as a potentially hostile fighter, with a particular missile of the platform 10?". This is a static question wherein an answer to the question provided as a direct answer, namely, YES or NO, alternatively N/A. The answer of a question of this type may be presented promptly, i.e. less than a one second (1 s).

An example question of the second simulation type [2] may be—"Is a particular platform X potentially dangerous for this platform 10?". This simulation may comprise a plurality of sub-simulations. For example, to determine if a particular platform X is dangerous for the own platform, a unique set-up of fictive weapon systems of the platform X may be included in each sub-simulation. The simulation (sub simulations) is run in real time and an answer to the posed question is provided after a simulation stop criteria is fulfilled, for example simulation run time of 10, 20 or 30 seconds.

An example question of the third simulation type [3] may be—"Can platform X escape from this platform 10?". This question may have relevance in a fighter-to-fighter combat scenario, for example. A simulation requiring prediction is generally run faster than real time regarding a time point of relevance $t_{rel}$ in the future. According to an embodiment of the invention the answer to the posed question is given 2-20 seconds after the question is posed, i.e. 2-20 after time t as indicated in FIG. 5. Preferably, the answer to the posed question is given after less than one second (1 s). More preferably, the answer to the posed question is given after less than 0.1 second. This simulation type [3] may comprise a plurality of sub-simulations.

An example question of the fourth simulation type [4] may be—"Has the airplane X energized, at the prospect of attacking own platform, since time Y?

This simulation is using "historical" surrounding information so as to perform an estimation process. According to an embodiment of the invention the answer to the posed question is provided 2-20 seconds after the question is posed, i.e. 2-20 after time t as indicated in FIG. 5. According to an embodiment historical information corresponding to a time period $t_{period}$ is used. The time period may be of arbitrary length, for example 10, 45, 90 seconds, or longer. Preferably, the answer to the posed question is provided 1-2 seconds after the time point t.

DETAILED DESCRIPTION OF THE DRAWINGS

Figure 1:
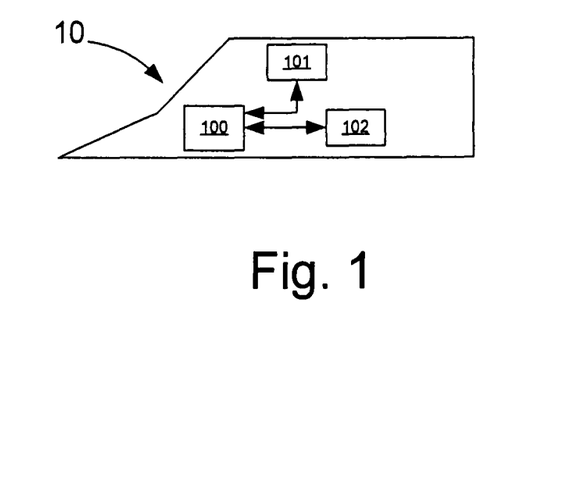
FIG. 1 schematically illustrates a platform according to an aspect of the present invention.

With reference to FIG. 1 a platform 10 is schematically shown. The platform may be an autonomous platform, such as an unmanned aerial vehicle (UAV). The platform may be an airplane, such as a passenger traffic airplane. Alternatively the airplane can be a military aircraft, such as a fighter, bomber, reconnaissance airplane, or a combination thereof. The autonomous platform can also be any kind of a helicopter, robot or missile.

It should be noted that the platform 10 alternatively can be a ground vehicle, water craft or underwater craft, e.g. an automobile, ship or submarine. Alternatively, the platform 10 can be a space craft or a satellite. The platform 10 comprises a simulation device 100, which is depicted in greater detail below.

The platform 10 is provided with a plurality of sensors and meters 101, hereinafter referred to as a set of sensors 101. The platform 10 is also provided with a communication unit 102 having a user interface. The communication unit 102 may comprise a touch-screen, key-pad, computer and/or monitor, for example. The communication unit 102 is also referred to as communication terminal 102. The set of sensors 101 and the communication unit 102 are both arranged for communication with the simulation device 100 as depicted in greater detail below.

Figure 2:
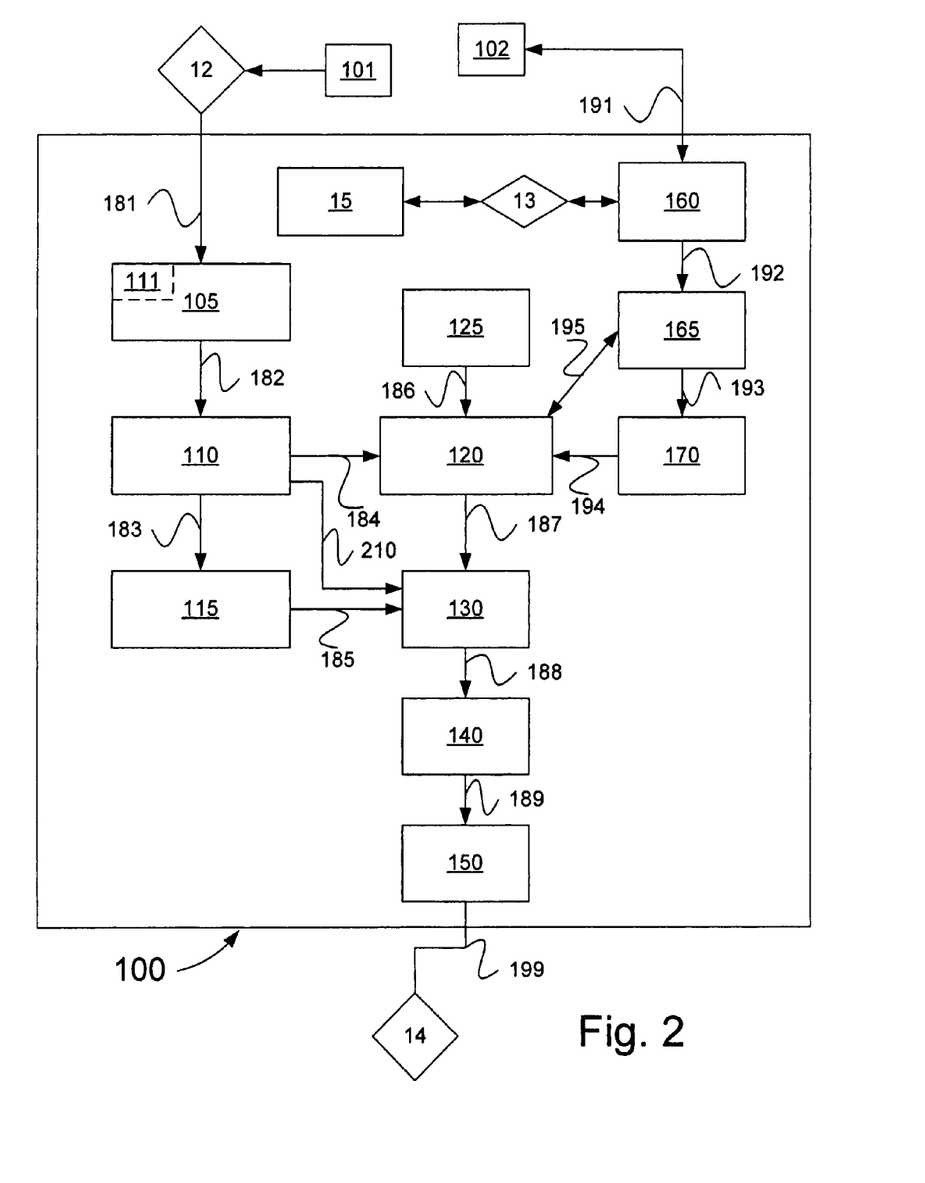
FIG. 2 schematically illustrates an overview of a simulation device according to an aspect of the present invention.

With reference to FIG. 2 the simulation device 100 is schematically shown. The simulation device 100 is, according to a preferred embodiment of the invention, provided in the platform 10. The simulation device 100 is also referred to as simulation arrangement 100.

Hereinafter the term "link" refers to a communication link which may be a physical connector, such as an optoelectronic communication wire, or a non-physical connector such as a wireless connection, for example a radio or microwave link.

The simulation device 100 is connected to the set of sensors 101 and the communication unit 102. The set of sensors 101 comprises a variety of different sensors. The number of sensors is an arbitrary number. Each sensor of the set of sensors is arranged to detect and/or measure at least one parameter and to communicate the sensor parameter information data 12 to the simulation device 100. Schematically shown in FIG. 2 the set of sensors 101 is arranged to communicate sensor parameter information data 12 to the simulation device 100 via a link 181. According to one embodiment of the invention, each sensor of the set of sensors 101 is arranged for communication with the simulation arrangement 100 by a separate link, respectively. Typical sensors are radar-, IR- and optical sensors. Further, other typical are sensors arranged to measure rudder angles, air pressure, and sensors arranged to provide information from other platform's links, such as an aircraft link or a robot link.

The communication unit 102 is according to one example embodiment a touch screen. The touch screen may be provided in a cock-pit of the platform 10. Of course the communication unit may be of a different kind, such as a keypad and corresponding monitor or a voice controlled display unit. Other user communication units which could be used are keyboards, mouse, keypads, handles etc.

The communication unit 102 is arranged to allow inputting of questions to the simulation device 100. The questions are pre-defined questions stored in a memory 15. According to one embodiment the memory 15 is a database. The communication unit 102 is arranged for communication with the memory 15 via a question information requesting unit 160. A user of the simulation device 100, e.g. a driver/pilot of the platform 10, may use the communication unit 102 so as to select questions to be answered by means of a simulation. Preferably questions are chosen and inputted in a sequential manner. The question information requesting unit 160 is arranged to request question data 13 from the memory 15. The question information 13 comprises information required for performing a relevant simulation so as to generate an answer to the posed question. The question information requesting unit is arranged to forward the question data to scenario modifying unit 165, which is depicted in greater detail below.

An updating unit 105 is arranged to receive environment information 12 from the set of sensors 101 via the link 181. The updating unit 105 is alternatively arranged to receive a part of the environment information 12 from an external source (not shown), such as a control tower and/or another platform. According to one embodiment the updating unit 105 is arranged to receive environment information 12 from both the set of sensors 101 and the external source simultaneously. The updating unit 105 is arranged to process said received information 12. The updating unit 105 is arranged to process the received information 12 and to update representations of existing registered entities in an environment of the platform 10. The updating process is preformed with regard to for example existence, positions of the entities and velocity vectors of the registered entities and a representation of the platform 10. Herein the term "entities" is synonymous with the term "platform".

An information processing unit 110 is arranged to continuously receive updated information from the updating unit 105 via a link 182. The information processing unit 110 is arranged to provide an environment model, which is continuously generated depending upon received updated information, which is sent from the updating unit 105. The environment model comprises information about the environment of the platform 10. More specifically, the environment model comprises information about existing entities, including the platform 10, having reference to for example existence, type of entities, positions of the entities and corresponding velocity vectors. The information processing unit 110 is arranged to store an updated generated environment model in an internal memory 111 on a regular basis, for example every second. Preferably the information processing unit 110 is arranged to continuously store an updated generated environment model in the internal memory of the information processing unit 110. The latest stored environment model is corresponding to a best current description of the environment of the platform 10. The environment model (EM) also comprises information about spatial data, position, velocities, accelerations, attitudes, angular velocities, angular velocities, and other sensor data, such as e.g. radar signature and optical picture. The environment model also comprises information about different air plane models.

At a moment when an answer to a question is posed, i.e. chosen and inputted (Time t), by means of the communication unit 102, a copy of the latest stored environment model (EM) is made. This copy is transferred to a simulation preparation unit 120 via a link 184 from the information processing unit 110. The simulation preparation unit 120 is arranged to receive and store the copy of the environment model (CEM). The simulation preparation unit 120 is arranged to assign different models to the entities of the received copy of the environment model. According to one embodiment of the invention default models are assigned to the different entities of the received copy of the environment model. A number of default models are stored in a default model storing unit 125, which is arranged for communication with the simulation preparation unit 120 via a link 186. The default model storing unit 125 is arranged to send one or more adequate default models to the simulation preparation unit 120 depending upon a request generated by the simulation preparation unit 120, which request is sent to the model storing unit 125. The default models are applied to the copy of the updated environment model, i.e. the environment model is prepared and processed for the simulation. Choice of default model is depending upon what particular question is posed. According to one embodiment a matching procedure is preformed wherein measured sensor data, for example related to another platform, and pre-stored sensor data is used so as to identify a most appropriate default model. One way to express this procedure is that the updated environment model is. "frozen" (copied) at the time when a question is posed by means of the communication unit 102. Information based on the environment model at this time is further sent to the simulation preparation unit 120 so as to constitute the base of a simulation model.

The question information requesting unit 160 is arranged to request and receive question information 13 stored in the memory 15 as a response to a request sent to the memory 15. The memory 15 can alternatively be located external of the simulation device 100. The question data information 13 comprises information relevant for further processing of the question posed by means of the communication terminal 102.

A scenario modification unit 165 is arranged to communicate with the simulation preparation unit 120 via a link 195. The scenario modification unit 165 is arranged to modify a scenario of a simulation relevant for the posed question. This means that entities of the copy of the environment model (CEM) provided in the simulation preparation unit 120 can be modified. Alternatively, entities of the copy of the environment model provided in the simulation preparation unit 120 can be deleted. Alternatively, additional fictive entities may be added to the environment model. According to an embodiment the modification is performed depending upon the particular posed question. According to an embodiment the modification is performed depending upon the particular type of the posed question. This can be performed before or after the one or more default model has been applied to the copy of the environment model.

According to one embodiment of the invention each entity of the environment model is a unique model of a particular predefined platform.

At least one, preferably all, of the representations of the originally detected entities and the added fictive entities can be modified such that a predetermined behavior of the entity can be changed. For example, in case one entity initially is assigned a behavior of an airplane in fighter mode, it can be changed to a behavior of an airplane being in reconnaissance mode.

The scenario modification unit 165 is arranged for communication with a question category information generating unit 170 via a link 193. The question category information generating unit 170 is also referred to as adjustment unit 170. The question category generating unit 170 is arranged for communication with the simulation preparation unit 120 via a link 194. The question category information generating unit 170 is arranged to generate question category information depending upon the type of the posed question. This generated question category information may be used as input information to the simulation preparation unit 120. The question category information is sent to the simulation preparation unit 120 via the link 194. The question category information comprises information about start and stop criterion for the simulation. Further the question category information comprises information about stop criterion, time, predetermined conditions etc. The simulation preparation unit 120 is arranged for communication with a simulation unit 130 via a link 187.

According to an embodiment of the invention there is provided one predetermined scenario for at least one predetermined question. According to an embodiment of the invention there is provided at least one, or a plurality of predetermined scenarios for each at least one predetermined question, respectively.

The information processing unit 110 is arranged for communication with a simulation history information unit 115. The simulation history information unit 115 is arranged to receive simulation information from the information processing unit 110 via a link 183. The received simulation information is stored in the simulation history unit 115. The simulation information comprises information about the updated environment models corresponding to a past time. According to an embodiment of the invention an arbitrary number of environment models are stored in the simulation history information unit 115. According to an embodiment of the invention only predetermined parts of the different environmental models are saved and stored in the simulation history information unit 115 for use in future simulations.

According to an embodiment of the invention a simulation unit 130 is arranged to perform a simulation process so as to achieve an answer to an inputted question. The simulation process can be of different types, depending upon what type of question is posed. This is depicted in greater detail herein. The simulation unit 130 is arranged to perform simulations for different types of posed questions, for example "static question", "dynamic question", "question requiring prediction simulation" and "question requiring estimation of historical data", according to what is depicted above.

The simulation unit 130 is arranged for communication with a logging unit 140 via link 188. The logging unit 140 is arranged for receiving the simulation result information sent from the simulation unit 130. According to one embodiment of the invention the logging unit 140 is arranged to check stop criterions during the at least one simulation being performed.

The logging unit 140 is arranged for communication with a valuing unit 150 via a link 189. The logging unit 140 is arranged to send the logged simulation result information to the valuing unit 150. The valuing unit 150 is arranged to evaluate the logged simulation result information.

The valuing unit 150 is arranged to output answer information 14 via a link 199. According to one embodiment the output answer information 14 is outputted to the communication terminal 102. According to one embodiment, in particular with reference to the question type 2, present status of relevant measurements is also outputted. The answer information 14 is preferably displayed or in any other way communicated to the driver of the platform.

Figures 3A, 3B:
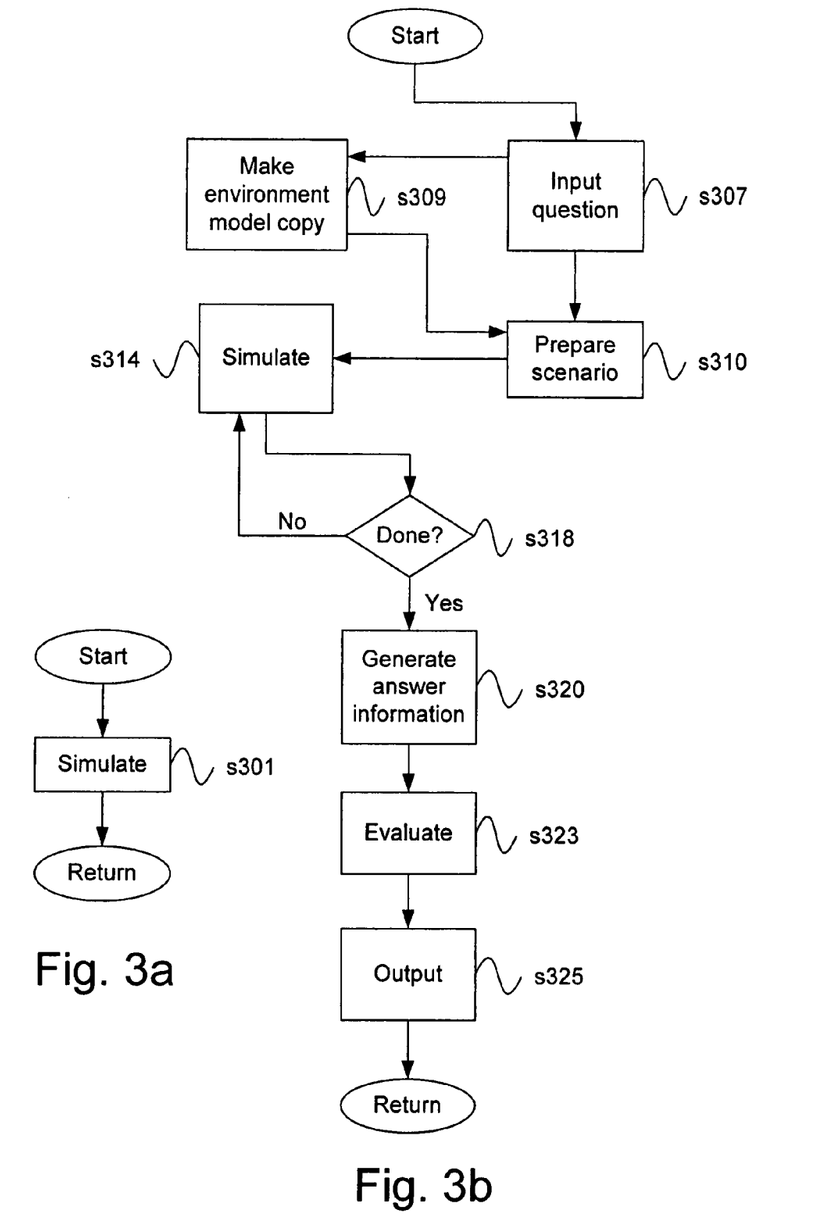
FIG. 3a schematically illustrates a simulation method according to an aspect of the present invention.
FIG. 3b schematically illustrates in greater detail a simulation method according to an aspect of the present invention.

FIG. 3a schematically illustrates a method for, within a platform, generating an answer to a posed question within a platform 10 by a simulation process according to an aspect of the invention. The method comprises a first method step s301. The first method step s301 comprises the sub-steps of:
  inputting a selected question associated with a first criterion and a second criterion;
  generating a copy of a continuously updated environment model;
  generating a simulation scenario, depending upon said first criterion;
  modifying the generated simulation scenario;
  applying the modified generated simulation scenario to the generated copy of the continuously updated environment model;
  performing a simulation process in accordance with the second criterion;
  generating answer information, depending upon a result of said simulation process.
Preferably the simulation method comprises the steps of:
  valuating the generated answer information;
  performing a filtering process, depending upon a result of said valuating step.
Preferably the simulation method comprises the step of:
  logging said generated answer information.
Preferably the simulation method comprises the step of:
  providing said generated answer information.
Preferably the simulation method comprises the steps of:
  providing information associated with updated environment models
  performing the simulation depending upon said provided information associated with updated environment models in real-time.
Preferably the simulation method comprises the step of:

providing historical information comprising information generated depending upon environment models corresponding to a time period before inputting the selected question.

Preferably the first criterion is relating to a category/type of the selected question and the second criterion is a stop criterion.

FIG. 3b schematically illustrates in greater detail a simulation method according to an aspect of the invention. The method comprises a first method step s307. In the method step s307 a driver/pilot of the platform 10 selects a question from a list of predetermined questions and input the same to the simulation device 100 according to the invention. After the method step s307 a subsequent method step s309 is performed.

In the method step s309 a copy is made of a continuously updated environmental model. The copy of the environment model is made depending upon the posed inputted question, i.e. when the question is inputted; a copy is made immediately thereafter. According to one embodiment the copy is generated as a direct consequence of the fact that a question is inputted. According to one embodiment the copy is made substantially immediately after the posed question is inputted. After the method step s309 a subsequent method step s310 is performed.

In the method step s310 the simulation is prepared. Among other things a scenario of the simulation is prepared. This is performed by applying at least one default model to the environment model. The default model may for example comprise one or more characteristics associated with the representations of the entities in the surroundings of the platform 10. The simulation scenario may be modified regarding the number of entities in the surroundings of the platform, as well as their respective behaviour, performance, equipment, characteristics, [weapons, loads, missions and routes, etc]. After the method step s310 a subsequent method step s314 is performed.

In the method step s314 the actual simulation is performed. The simulation may be performed in a variety of different ways, of which four are depicted with reference to the herein disclosed simulation examples 1-4 below.

It should be noted that the simulation unit 130 is arranged to perform a plurality of simulations simultaneously, wherein each simulation is relating to one posed question. According to an embodiment of the invention the simulation unit 130 is arranged to perform a plurality of simulations simultaneously, wherein each simulation is relating to at least one posed question. It should further be noted that the simulation unit 130 is arranged to perform a plurality of sub-simulations simultaneously, wherein each sub-simulation is relating to a posed question, or to an aspect of a posed question.

A loop comprising the method step s318 is continuously performed so as to check whether the simulation is completed or not. This can for example be performed by checking if a preset stop criterion is met. If the simulation is completed a subsequent method step s320 is performed. If the simulation is not completed, the simulation is continued. The method step s318 is optional according to one embodiment of the invention.

In the method step s320 answer information is generated. The answer information is generated depending upon the result of the simulation. For example, the answer information may consist of a text string giving the answer to the posed question.

During simulation status information may be provided continuously if desired regarding a particular posed question. After a simulation is completed the answer is associated with more presentation friendly information. For example, if the answer to a posed question is "45 seconds", the answer may be associated with an information piece comprising information indicating that "if own platform will continue on course a hostile zone will be reached".

After the method step s320 a subsequent method step s323 is performed. In the method step s323 the result of the simulation is evaluated. Evaluation of the simulation result here means checking validity of the same. This can be performed by a matching procedure so as to determine if the simulation result is reasonable. The matching procedure may involve a comparison between the simulation result and pre-stored predetermined boundary values relevant for a particular posed question and a given scenario modification. The method steps s320 and 323 is according to one embodiment sequentially interchangeable. After the method step s323 a subsequent method step s325 is performed.

In the method step s325 the answer information is outputted. Preferably, the outputted answer information is provided to means for presenting the information, such as a display or a loud speaker, for example. After the method step s325 the method ends.

Example 1

This example relates to a simulation regarding a "static" question in real time. In particular with reference to FIG. 2 and FIG. 3a-b, the copy of the environmental model is sent from the updating unit 110 to the simulation preparation unit 120. After scenario editing etc. the simulation is performed in the unit 130 and a valuated simulation result (answer information) is outputted according to the description above.

Example 2

This example relates to a simulation regarding a "dynamic" question in real time. In particular with reference to FIG. 2 and FIG. 3a-b, the copy of the environmental model is sent from the updating unit 110 to the simulation preparation unit 120. However, in this case the updating unit 110 is providing the simulation unit 130 with updated information. According to one embodiment the updating unit 110 is continuously providing the simulation unit 130 with information associated with updated environment models for use in the actual simulation. According to one embodiment of the invention the updating unit is providing the updated information via the link 210 direct to the simulation unit 130. According to another embodiment the updated information is provided to the simulation unit 130 via the simulation preparation unit 120 or the unit 115.

Example 3

This example relates to a simulation regarding a simulation relating to a question requiring prediction simulation. The procedure of performing the simulation in this case corresponds to what is depicted with reference to the example 1. Thus, only the environment information provided to the simulation preparation unit 120 as a copy of the updated environment model generated in the updating unit 110 is used as basic information of the simulation.

Example 4

This example relates to a simulation regarding a simulation relating to a question requiring estimation of historical data. In this case the unit 115 is providing the simulation unit 130 with history information to be incorporated in the simulation. The history information is according to one embodiment a batch of copies of former updated environment models generated by the updating unit 110. This batch of environment models is relating to a particular passed time period, for example the latest 30 seconds relative a given moment, preferably the time point when the posed question was inputted to the simulation device 100 via the communication unit 102. This time point is also referred to as t, with reference to FIG. 5.

The architecture of the simulation device is thus providing a flexible arrangement for answering to different types of complex posed questions by means of simulations.

Figure 4:
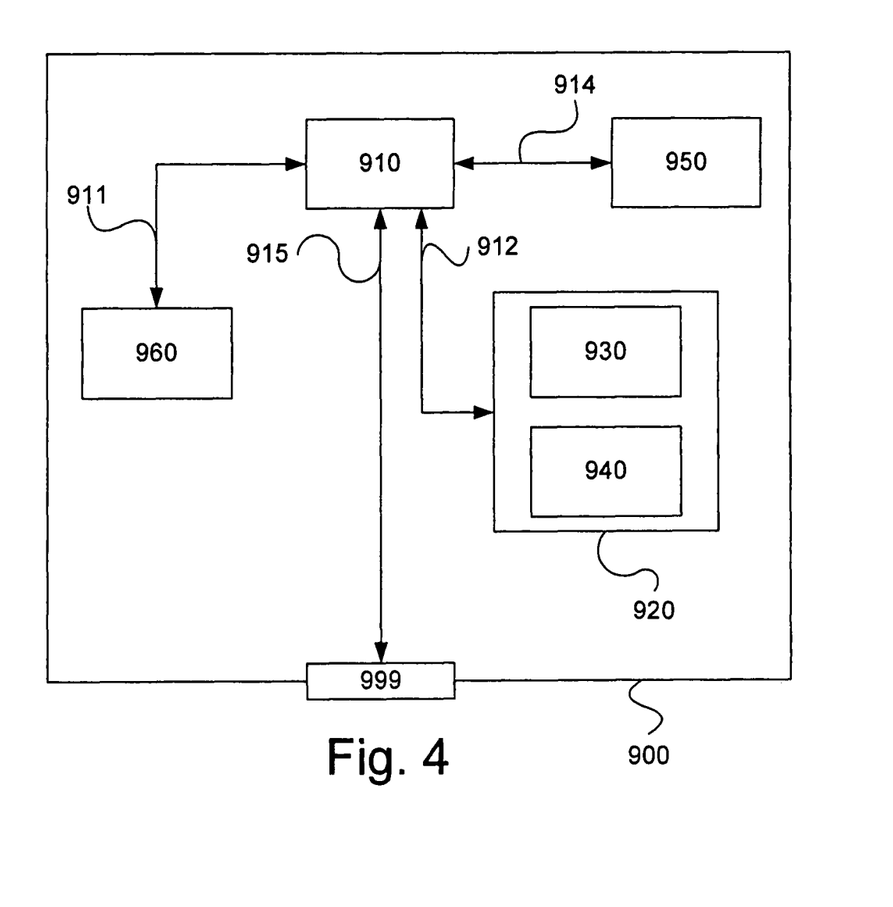
FIG. 4 schematically illustrates an apparatus according to an aspect of the present invention.

With reference to FIG. 4, a diagram of one embodiment of an apparatus 900 is shown. Apparatus 900 comprises a non-volatile memory 920, a data processing device 910 and a read/write memory 950. Non-volatile memory 920 has a first memory portion 930 wherein a computer program, such as an operating system, is stored for controlling the function of apparatus 900. Further, apparatus 900 comprises a bus controller, a serial communication port, I/O-means, an A/D-converter, a time date entry and transmission unit, an event counter and an interrupt controller (not shown). Non-volatile memory 920 also has a second memory portion 940.

A computer program comprising routines for autonomous controlling of control systems of a platform is provided. The program may be stored in an executable manner or in a compressed state in a separate memory 960 and/or in read/write memory 950.

When it is stated that data processing device 910 performs a certain function it should be understood that data processing device 910 performs a certain part of the program which is stored in separate memory 960, or a certain part of the program which is stored in read/write memory 950.

Data processing device 910 may communicate with a data port 999 by means of a data bus 915. Non-volatile memory 920 is adapted for communication with data processing device 910 via a data bus 912. Separate memory 960 is adapted to communicate with data processing device 910 via a data bus 911. Read/write memory 950 is adapted to communicate with data processing device 910 via a data bus 914.

When data is received on data port 999 it is temporarily stored in second memory portion 940. When the received input data has been temporarily stored, data processing device 910 is set up to perform execution of code in a manner as described above. According to one embodiment, data received on data port 999 comprises information such as input signals from sub-systems of the platform. This information can be used by apparatus 400 so as to perform controlling of the autonomous platform according to the invention.

Parts of the methods described herein can be performed by apparatus 400 by means of data processing device 910 running the program stored in separate memory 960 or read/write memory 950. When apparatus 400 runs the program, parts of the methods described herein are executed.

An aspect of the invention relates to a computer programme comprising a programme code for performing the method steps depicted with reference to FIGS. 3*a* and 3*b*, respectively, when the computer programme is run on a computer.

An aspect of the invention relates to a computer programme product comprising a program code stored on computer-readable media for performing the method steps depicted with reference to FIGS. 3*a* and 3*b*, respectively, when the computer programme is run on the computer.

An aspect of the invention relates to a computer programme product directly storable in an internal memory of a computer, comprising a computer programme for performing the method steps depicted with reference to FIGS. 3*a* and 3*b*, respectively, when the computer programme is run on the computer.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated.

The invention claimed is:

1. A simulation device for generating an answer to a posed question related to at least one of situation analysis or choice of tactics inputted thereto, said device being provided on a platform, the device comprising:
a communication module configured to input from a plurality of predetermined questions a selected question associated with a first criterion and a second criterion, wherein the first criterion relates to a category or type of the selected question, and wherein the second criterion is a stop criterion;
a model generator configured to generate a copy of a continuously updated environment model based on sensor data depending upon the posed inputted question, wherein the environmental model comprises information about existing entities in an environment of the platform;
a simulation generating module configured to prepare a simulation scenario, and arranged to apply at least one default model to a number of different entities of the environmental model depending upon said first criterion, wherein the at least one default model comprises at least one characteristic associated with representations of the entities, wherein the simulation generating module is further configured to perform a matching procedure to identify the at least one default model based on measured sensor data and pre-stored sensor data to provide the environmental model with information about different air plane models;
a scenario modifying module configured to modify the prepared simulation scenario with respect to the number of entities and at least one of behavior, performance, equipment or characteristics associated with the entities depending upon at least one of the posed question or type of posed question;
a scenario applying module configured to apply the modified prepared simulation scenario to the generated copy of the continuously updated environment model;
a simulation performing module configured to perform a simulation process in accordance with the second criterion;
an answer generating module configured to generate answer information, depending upon a result of said simulation process; and
a processing device configured to carry out portions of the functions of the simulation device.

2. The simulation device according to claim 1, further comprising:
a valuation module configured to valuate the generated answer information; and
a filtering module configured to perform a filtering process, depending upon a result of said valuating.

3. The simulation device according to claim 1, further comprising:
  a logging module configured to log said generated answer information.

4. The simulation device according to claim 1, further comprising:
  an information providing module configured to provide information associated with updated environment models, and
  a simulation performing module configured to perform the simulation depending upon said provided information associated with updated environment models in real-time.

5. The simulation device according to claim 1, further comprising:
  an historical information providing module configured to provide historical information comprising information generated depending upon environment models corresponding to a time period before inputting the selected question.

6. A platform, comprising:
  a simulation device for generating an answer to a posed question related to at least one of situation analysis or choice of tactics inputted thereto, said device being provided on a platform, the device comprising
    a communication module configured to input from a plurality of predetermined questions a selected question associated with a first criterion and a second criterion, wherein the first criterion relates to a category or type of the selected question, and wherein the second criterion is a stop criterion;
    a model generator configured to generate a copy of a continuously updated environment model based on sensor data depending upon the posed inputted question, wherein the environmental model comprises information about existing entities in an environment of the platform;
    a simulation generating module configured to prepare a simulation scenario, and arranged to apply at least one default model to a number of different entities of the environmental model depending upon said first criterion, wherein the at least one default model comprises at least one characteristic associated with representations of the entities, wherein the simulation generating module is further configured to perform a matching procedure to identify the at least one default model based on measured sensor data and pre-stored sensor data to provide the environmental model with information about different air plane models;
    a scenario modifying module configured to modify the prepared simulation scenario with respect to the number of entities and at least one of behavior, performance, equipment or characteristics associated with the entities depending upon at least one of the posed question or type of posed question;
    a scenario applying module configured to apply the modified prepared simulation scenario to the generated copy of the continuously updated environment model;
    a simulation performing module configured to perform a simulation process in accordance with the second criterion;
    an answer generating module configured to generate answer information, depending upon a result of said simulation process; and
    a processing device configured to carry out portions of the functions of the simulation device; and
  a vehicle on which the simulation device is provided.

7. A simulation method for, within a platform, generating answers to a question relating to at least one of situation analysis or choice of tactics fed to a simulation device, the method comprising:
  inputting from a plurality of predetermined questions a selected question associated with a first criterion and a second criterion, wherein the first criterion relates to a category/type of the selected question, and wherein the second criterion is a stop criterion;
  generating a copy of a continuously updated environment model based on sensor data, depending upon the posed inputted question, wherein the environmental model comprises information about existing entities in an environment of the platform;
  preparing a simulation scenario by applying at least one default model to different entities of the environmental model depending upon said first criterion, wherein the at least one default model comprises at least one characteristic associated with representations of the entities, wherein preparing the simulation scenario comprises performing a matching procedure to identify the at least one default model based on measured sensor data and pre-stored sensor data and providing the environmental model with information about different air plane models;
  modifying the prepared simulation scenario with respect to the number of entities and at least one of behavior, performance, equipment or characteristics associated with the entities depending upon at least one of the particular posed question or type of posed question;
  applying the modified prepared simulation scenario to the generated copy of the continuously updated environment model;
  performing a simulation process in accordance with the second criterion; and
  generating answer information, depending upon a result of said simulation process.

8. The simulation method according to claim 7, further comprising:
  valuating the generated answer information; and
  performing a filtering process, depending upon a result of said valuating step.

9. The simulation method according to claim 7, further comprising:
  logging said generated answer information.

10. The simulation method according to claim 7, further comprising:
  providing information associated with updated environment models; and
  performing the simulation depending upon said provided information associated with updated environment models in real-time.

11. The simulation method according to claim 7, further comprising:
  providing historical information comprising information generated depending upon environment models corresponding to a time period before inputting the selected question.

12. A computer program product, comprising:
  a non-transitory computer readable medium; and
  computer program instructions recorded on the computer readable medium and executable by a processor for performing a simulation method comprising inputting from a plurality of predetermined questions a selected question associated with a first criterion and a second criterion, wherein the first criterion relates to a category/type of the selected question, and wherein the second criterion is a stop criterion, generating a copy of a continuously updated environment model based on sensor data, depending upon the posed inputted question, wherein the environmental model comprises information about existing entities in an environment of the platform, preparing a simulation scenario by applying at least one default model to different entities of the environmental model depending upon said first criterion, wherein the at least one default model comprises at least one characteristic associated with representations of the entities, wherein preparing the simulation scenario comprises performing a matching procedure to identify the at least one default model based on measured sensor data and pre-stored sensor data and providing the environmental model with information about different air plane models, modifying the prepared simulation scenario with respect to the number of entities and at least one of behavior, performance, equipment or characteristics associated with the entities depending upon at least one of the particular posed question or type of posed question, applying the modified prepared simulation scenario to the generated copy of the continuously updated environment model, performing a simulation process in accordance with the second criterion, and generating answer information depending upon a result of said simulation process.

13. The platform according to claim 6, wherein the platform comprises a flying vehicle selected from the group comprising an aircraft, an airplane, or a helicopter.

14. The platform according to claim 6, wherein the platform comprises a watercraft selected from the group comprising a boat or a ship.

15. The platform according to claim 6, wherein the platform comprises an under watercraft comprising a submarine.

16. The platform according to claim 6, wherein the platform comprises a land vehicle selected from the group comprising an automobile, a train, or a cross-country vehicle.

* * * * *